(12) United States Patent
Iwashita et al.

(10) Patent No.: US 7,005,947 B2
(45) Date of Patent: Feb. 28, 2006

(54) SURFACE ACOUSTIC WAVE ELEMENT, FREQUENCY FILTER, OSCILLATOR, ELECTRONIC CIRCUIT, AND ELECTRONIC INSTRUMENT

(75) Inventors: Setsuya Iwashita, Nirasaki (JP); Takamitsu Higuchi, Matsumoto (JP); Hiromu Miyazawa, Toyoshina-machi (JP)

(73) Assignee: Seiko Epson Corporation, (JP)

( * ) Notice: Subject to any disclaimer, the term of this patent is extended or adjusted under 35 U.S.C. 154(b) by 28 days.

(21) Appl. No.: 10/798,978

(22) Filed: Mar. 11, 2004

(65) Prior Publication Data
US 2004/0233017 A1     Nov. 25, 2004

(30) Foreign Application Priority Data
Mar. 26, 2003   (JP)   ............... 2003-085759

(51) Int. Cl.
H03H 9/64   (2006.01)
H03H 9/05   (2006.01)
H03B 5/32   (2006.01)

(52) U.S. Cl. .................. 333/193; 333/150; 310/313 A; 331/116 R (58) Field of Classification Search ........ 333/193–196, 333/150–155, 133; 310/313 A, 313 B, 313 D; 331/116 R
See application file for complete search history.

(56) References Cited

U.S. PATENT DOCUMENTS

| | | | |
|---|---|---|---|
| 6,045,626 A * | 4/2000 | Yano et al. | 148/33.4 |
| 6,198,208 B1 * | 3/2001 | Yano et al. | 310/358 |
| 6,258,459 B1 * | 7/2001 | Noguchi et al. | 428/446 |
| 6,555,946 B1 * | 4/2003 | Finder et al. | 310/324 |
| 6,583,690 B1 * | 6/2003 | Lee et al. | 333/193 |
| 6,855,996 B1 * | 2/2005 | Noguchi et al. | 257/419 |
| 2003/0011280 A1 * | 1/2003 | Nakahata et al. | 310/313 R |

FOREIGN PATENT DOCUMENTS

| | | |
|---|---|---|
| JP | 01-103310 | 4/1989 |
| JP | 06-120416 | 4/1994 |
| JP | 07-050436 | 2/1995 |
| JP | 2001-196892 | 7/2001 |
| JP | 2003-017981 | 1/2003 |

OTHER PUBLICATIONS

Patent Abstracts of Japan, 2001-196892 (2 pages), Jul., 2001.

(Continued)

*Primary Examiner*—Barbara Summons
(74) *Attorney, Agent, or Firm*—Harness, Dickey & Pierce, P.L.C.

(57) ABSTRACT

A surface acoustic wave element includes a single crystal substrate; a buffer layer formed by a crystal film that is formed on top of the single crystal substrate; and a piezoelectric thin film having a hexagonal system or a trigonal system crystal structure that is formed on top of the buffer layer. The surface acoustic wave element has an improved performance by improving the film quality of the piezoelectric thin film. In addition, because a semiconductor device can be formed on the single crystal substrate, the surface acoustic wave element can be integrated with the semiconductor device. Moreover, leakages of surface acoustic waves into the single crystal substrate are prevented. There are also provided a frequency filter, an oscillator, an electronic circuit, and an electronic instrument that are provided with this surface acoustic wave element.

13 Claims, 8 Drawing Sheets

OTHER PUBLICATIONS

Patent Abstracts of Japan. 2003-017981 (2 pages), Jan. 2003.
Patent Abstracts of Japan, 07-050436 (2 pages), Feb. 1995.
Patent Abstracts of Japan, 01-103310 (2 pages), Apr. 1989.
Patent Abstracts of Japan, 06-120416 (2 pages), Apr. 1994.

Shibata, Yoshihiko et al, Epitaxial growth and surface-acoustic-wave properties of LiTaO3 films grown by pulsed laser deposition, Appl Phys Letter 62, Jun. 7, 1993, pps. 3046-3048.

* cited by examiner

SURFACE ACOUSTIC WAVE ELEMENT, FREQUENCY FILTER, OSCILLATOR, ELECTRONIC CIRCUIT, AND ELECTRONIC INSTRUMENT

BACKGROUND OF THE INVENTION

1. Field of the Invention

Priority is claimed on Japanese Patent Application No. 2003-85759, filed Mar. 26, 2003, the content of which is incorporated herein by reference.

The present invention relates to a surface acoustic wave element, a frequency filter, an oscillator, an electronic circuit, and an electronic instrument.

2. Description of Related Art

In accompaniment with the remarkable developments in the field of communications centering on mobile communications such as mobile phones, recent years have seen a rapid increase in the demands placed on surface acoustic wave elements and various types of instruments that use surface acoustic wave elements. Surface acoustic wave elements were developed using single crystal such as quartz, however, in view of the movement in recent years towards still higher frequencies, or in view of the integration thereof with semiconductor devices, the development of surface acoustic wave elements formed by piezoelectric thin films is currently demanded.

Examples of surface acoustic wave elements that use piezoelectric thin films include zinc oxide thin films formed on a sapphire substrate (see, for example, Japanese Patent Application Unexamined Publication No. 7-50436), those formed by forming a diamond-like carbon film on a silicon substrate, and then forming a zinc oxide thin film on top of the diamond-like carbon film layer as a piezoelectric film (see, for example, Japanese Patent Application Unexamined Publication No. 1-03310), and those formed by forming a lithium niobate thin film on a sapphire substrate (see, for example, Appl. Phys. Lett. Vol. 62 (1993) pp. 3046–3048).

The integrating of a surface acoustic wave element such as those described above with a semiconductor device on a silicon substrate is useful for miniaturizing or improving the performance of various types of instrument that use surface acoustic wave elements. Examples of this include devices obtained by coupling a separately manufactured surface acoustic wave element formed by a single crystal with a semiconductor device formed on a silicon substrate (see, for example, Japanese Patent Application Unexamined Publication No. 6-120416). However, there are no examples of the integration of a semiconductor device with a surface acoustic wave element that uses a piezoelectric thin film.

The problems described below are inherent in the above described conventional technology.

Firstly, although it is possible to manufacture a high quality epitaxial thin film when forming a zinc oxide thin film or a lithium niobate thin film on a sapphire substrate, there has been a drawback in that sapphire substrates are more expensive than silicon substrates, and forming a semiconductor device such as a complimentary metal oxide semiconductor (CMOS) has been difficult.

On the other hand, it is difficult to epitaxially grow a zinc oxide thin film or a lithium niobate thin film on a silicon substrate. Moreover, even if it were possible to grow these directly so as to manufacture a surface acoustic wave element, because the silicon substrate is a semiconductor, the surface acoustic wave ends up leaking onto the silicon substrate so that there would be considerable insertion loss.

Furthermore, when growing a zinc oxide thin film, a lithium niobate thin film or a lithium tantalate thin film on a diamond-like carbon film formed on a silicon substrate, it has proven difficult to form a semiconductor device on the diamond-like carbon film.

In addition, when coupling a separately manufactured surface acoustic wave element formed by a single crystal on a silicon substrate on which a semiconductor device is formed, the characteristics of the surface acoustic wave element are determined by the cut angle of the material. In contrast, when forming a surface acoustic wave element using a piezoelectric thin film, it is possible to control the electromechanical coupling coefficient (represented below as $k^2$) and acoustic velocity by controlling the film thickness of the piezoelectric thin film. As a result, there is a high degree of freedom when designing the element. Therefore, when forming a surface acoustic wave element from a single crystal, it might be considered that, if the single crystal is made thin, it may be possible to control the $k^2$ and acoustic velocity characteristics in the same way as if the surface acoustic wave element were formed using a piezoelectric thin film. However, currently, it is substantially impossible to make the thickness of a single crystal thin enough to be at the level of a thin film.

The present invention was conceived in view of the above circumstances, and it is an object thereof to provide a surface acoustic wave element that has improved performance as a result of the film quality of the piezoelectric thin film being improved, and that, because it is possible to form a semiconductor device on a single crystal substrate, can be integrated with a semiconductor device, and that prevents leakages of the surface acoustic wave to the single crystal substrate. It is also an object of the present invention to provide a frequency filter, an oscillator, an electronic circuit, and an electronic instrument that are equipped with this surface acoustic wave element.

SUMMARY OF THE INVENTION

In order to achieve the aforementioned object, according to an aspect of the present invention, there is provided a surface acoustic wave element comprising: a single crystal substrate; a buffer layer formed by a crystal film that is formed on the single crystal substrate; and a piezoelectric thin film having a hexagonal system or a trigonal system crystal structure that is formed on the buffer layer.

With this surface acoustic wave element, because a piezoelectric thin film is grown on a buffer layer that is formed by a crystal film, the piezoelectric thin film has excellent film qualities such as being an epitaxial film and, accordingly, the surface acoustic wave element itself also has excellent properties. Moreover, because a semiconductor device can be formed on the single crystal substrate, integration of semiconductor devices becomes possible. In this case, because the buffer layer has a function of preventing leakages of surface acoustic waves into the single crystal substrate, the characteristics of the surface acoustic wave element are maintained at an excellent level with no loss thereof occurring.

Preferably, in the above surface acoustic wave element, the single crystal substrate is a single crystal silicon substrate.

With this structure employed, because a single crystal silicon substrate is lower in cost compared, for example, to a sapphire substrate, the cost of the surface acoustic wave element itself can be kept low.

Preferably, the single crystal silicon substrate has a face orientation of (111).

With this structure employed, it is possible to optimize the crystal orientation of the buffer layer formed by the crystal film formed on the single crystal silicon substrate.

Preferably, the buffer layer is an epitaxial film.

With this structure employed, it is possible to improve the film quality of the piezoelectric thin film formed on the buffer layer. Accordingly, it is possible to further improve the performance of the surface acoustic wave element itself.

Preferably, the buffer layer is formed by a rare earth oxide.

With this structure employed, if a film having an alkaline metal is formed as the piezoelectric thin film, and if a semiconductor device is formed on a single crystal substrate, then it is possible, using the buffer layer, to prevent the alkaline metal in the piezoelectric thin film from spreading into the single crystal substrate. Accordingly, it is possible to prevent the alkaline metal from having any harmful effect on the semiconductor device.

Preferably, the single crystal substrate has natural oxide film formed from a silicon oxide formed on a surface thereof.

With this structure employed, the buffer layer formed by the rare earth oxide is formed with more improved properties on this natural oxide film by growing while consuming oxygen in the natural oxide film.

Preferably, in the above surface acoustic wave element, the piezoelectric thin film is an epitaxial film.

With this structure employed, because the piezoelectric thin film has excellent film quality, the surface acoustic wave element itself also has excellent properties.

Preferably, in the above surface acoustic wave element, the piezoelectric thin film having the hexagonal system or trigonal system crystal structure is any one of ZnO, AlN, $LiTaO_3$, $LiNbO_3$, or $LiNb_{1-x}Ta_xO_3$ (wherein $0<x<1$).

With this structure employed, the surface acoustic wave element itself is provided with excellent properties as a result of a piezoelectric thin film having a desired orientation being efficiently formed.

Preferably, the above surface acoustic wave element further comprises an electroconductive film provided between the buffer layer and the piezoelectric thin film.

With this structure employed, even if it is difficult for the piezoelectric thin film to be placed directly on the buffer layer due to the material used to form the buffer layer, by interposing the electroconductive film the piezoelectric thin film can be favorably positioned and a film grown. Accordingly, it is possible to select a material capable of having a high electromechanical coupling coefficient as the piezoelectric thin film, which enables the surface acoustic wave element itself to have improved properties.

Preferably, the electroconductive film is formed from metal or from a hexagonal system oxide. In particular, if the electroconductive film is formed from a hexagonal system oxide, then it is preferable that the hexagonal system oxide is an oxygen deficient electron carrier type of zinc oxide.

With this structure employed, then, particularly, when the electroconductive film is formed from zinc oxide, the electroconductive film having a desired orientation is formed efficiently on the single crystal substrate, resulting in the surface acoustic wave element itself being provided with excellent properties.

Preferably, the electroconductive film is an epitaxial film.

With this structure employed, because the electroconductive film has an excellent film quality, the surface acoustic wave element itself is also provided with excellent properties.

According to another aspect of the present invention, there is provided a frequency filter comprising: a first electrode that is formed on the piezoelectric thin film or on a protective film provided on the piezoelectric thin film that is provided in the above described surface acoustic wave element; and a second electrode that is formed on the piezoelectric thin film or the protective film, and that converts surface acoustic waves generated in the piezoelectric thin film by electrical signals applied to the first electrode into electrical signals in resonance with a specific frequency or with frequencies of a specific band.

With this frequency filter, because the piezoelectric thin film has a high electromechanical coupling coefficient, the proportional bandwidth is broad and provides excellent properties.

According to a further aspect of the present invention, there is provided an oscillator comprising: an electrode for applying electrical signals that is formed on the piezoelectric thin film or on a protective film formed on the piezoelectric thin film that is provided in the above described surface acoustic wave element, and that generates surface acoustic waves in the piezoelectric thin film using electrical signals applied thereto; and an oscillation circuit that is formed on the piezoelectric thin film or the protective film, and that includes a transistor and a resonating electrode that resonates a specific frequency component or frequency components of a specific band of the surface acoustic waves generated by the electrode for applying electrical signals.

With this oscillator, because the piezoelectric thin film provided in the surface acoustic wave element has a high electromechanical coupling coefficient, it is possible to omit the extension coil, and it is therefore possible to provide an oscillator having a simple circuit structure. Moreover, because the oscillator is provided with an oscillation circuit formed by a transistor and the like, the oscillator can be reduced in size by integration with the transistor.

According to still another aspect of the present invention, there is provided an electronic circuit comprising: the above described oscillator; and an electrical signal supply element that applies the electrical signals to the electrode for applying electrical signals provided in the oscillator, wherein the electronic circuit has a function of selecting a specific frequency component from frequency components of the electrical signals, or of converting the electrical signals into a specific frequency component, or of imparting predetermined modulation to the electrical signals and performing a predetermined demodulation, or of performing a predetermined wave detection.

With this electronic circuit, because the piezoelectric thin film that forms the surface acoustic wave element provided in the oscillator has a high electromechanical coupling coefficient and integration thereof with the oscillation circuit is possible, the electronic circuit is small in size and has a high level of performance.

According to yet another aspect of the present invention, there is provided an electronic instrument provided with at least one of the above described frequency filter, the above described oscillator, and the above described electronic circuit.

With this electronic instrument, because the piezoelectric thin film has a high electromechanical coupling coefficient, the electronic instrument is small in size and has a high level of performance.

DETAILED DESCRIPTION OF THE INVENTION

Embodiments of the surface acoustic wave element, frequency filter, oscillator, electronic circuit and electronic instrument according to the present invention will now be described with reference made to the drawings.

The drawings are all schematic views and the scale of each member has been varied in order to make the size of each member such that it can be easily recognized in the drawings.

(First Embodiment)

Figure 1:
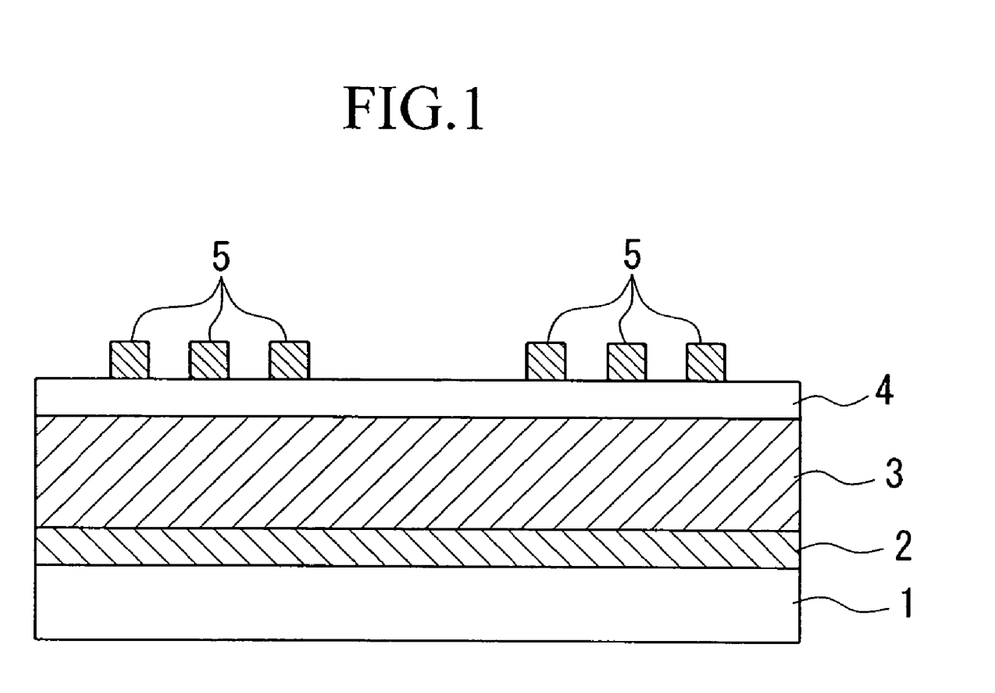
FIG. 1 is a side cross-sectional view showing a surface acoustic wave element according to the first embodiment.

The structure of the surface acoustic wave element of the first embodiment is shown in FIG. 1.

The surface acoustic wave element is formed by a single crystal silicon substrate 1, a buffer layer 2, a piezoelectric thin film 3, a protective layer 4 formed from an oxide or nitride that functions as a protective film, and electrodes 5. The electrodes 5 are inter-digital transducer electrodes (referred to below as IDT electrodes) that, when viewed from above, may, for example, have a configuration such as that of the IDT electrodes 41, 42, 51, 52, and 53 shown in FIGS. 4 and 5, which are described below.

In order to manufacture a surface acoustic wave element having the above described structure, firstly, a Si(111) substrate on whose surface a natural oxide film has been formed is prepared as the single crystal silicon substrate 1. Note that, as the single crystal silicon substrate 1 prepared here, it is also possible to use a semiconductor device such as a thin film transistor (TFT) that has been prepared in advance. In this case, the surface wave acoustic element that is obtained is integrated with this semiconductor device.

Next, the buffer layer 2 is formed on the single crystal silicon substrate 1 using a crystal film of Y$_2$O$_3$, which is a rare earth oxide. There is no particular restriction as to the method of forming the film and, for example, a known film forming method such as a sputtering method, an evaporation method, or an MBE method may be used. In the present embodiment, a laser ablation method, which is a type of evaporation method, is used.

Using a Y$_2$O$_3$ ceramic as the target, the film forming temperature (i.e., the substrate temperature) was set to 650° C., while the degree of vacuum during the film formation was set to $1.33 \times 10^{-3}$ Pa ($1 \times 10^{-5}$ Torr) or less. Note that the film formation conditions are not limited to these. Moreover, particularly, if a semiconductor device is formed in advance on the single crystal silicon substrate 1, then it is also possible to lower the substrate temperature and to heat portions of the buffer layer 2 by irradiating a laser onto the buffer layer 2 so as to perform the crystallization.

By forming a film under conditions such as these, the thin film of Y$_2$O$_3$ grows epitaxially on the single crystal silicon substrate 1, and the buffer layer 2 is formed by crystal film having a favorable orientation, namely, the same (111) orientation as the single crystal silicon substrate 1. Here, because the single crystal silicon substrate 1 that is used has a natural oxide film formed on the surface thereof, the buffer layer 2 grows while absorbing oxygen of the natural oxide film on this surface. As a result, the epitaxial growth proceeds in an excellent condition.

Note that the film thickness of this Y$_2$O$_3$ thin film (i.e., of the buffer layer 2) is preferably 50 nm or more as it serves as a foundation for the growth of the piezoelectric thin film on top of the Y$_2$O$_3$ thin film, as is described below. Moreover, in order to prevent leakages of surface acoustic waves into the single crystal silicon substrate 1, the Y$_2$O$_3$ thin film is preferably as thick as possible. Accordingly, in the present embodiment, the film thickness of the buffer layer 2 is set to 1 μm. However, it is to be understood that the film thickness is not limited to this size.

Next, a lithium niobate (LiNbO$_3$) thin film that functions as a piezoelectric thin film 3 having a trigonal system crystal structure is formed on the buffer layer 2. The method used to form this film is not particularly limited and a known film forming method may be employed such as a sputtering method, an evaporation method, an MBE method, and a CVD method as well as a liquid phase process such as a spin coating method or a droplet discharge method (i.e., an inkjet method). In the present embodiment, a laser ablation method is used.

As the film forming conditions, if the film is prepared with the film forming temperature (i.e., the substrate temperature) at 500° C., and the oxygen partial pressure at 1.33 Pa (0.01 Torr), then the crystal structure of the Y$_2$O$_3$ thin film of the foundation is continued, and the LiNbO$_3$ thin film also grows epitaxially. At this time, the orientation of the LiNbO$_3$ thin film is a c axial orientation. Note that it is to be understood that the film forming conditions are not limited to these conditions.

If an attempt is made to form the LiNbO$_3$ thin film serving as the piezoelectric thin film 3 directly on top of the single crystal silicon substrate 1, it is difficult to achieve epitaxial growth due to lattice mismatching and Li scattering and the like. However, by using a rare earth oxide to form the buffer layer 2, it becomes possible to form the LiNbO$_3$ thin film (i.e., the piezoelectric thin film 3).

If the buffer layer 2 is amorphous, the LiNbO$_3$ thin film does not grow epitaxially. Namely, the LiNbO$_3$ thin film is a crystallized crystal film and, in particular, by forming it on top of the epitaxially grown buffer layer 2, the LiNbO$_3$ thin film (i.e., the piezoelectric thin film 3) is also made to grow epitaxially.

Figure 2A:
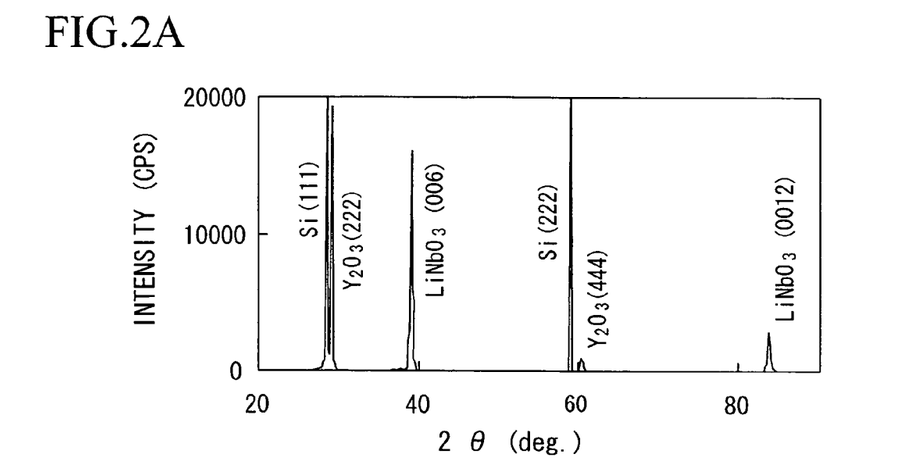
FIGS. 2A to 2C are views showing the results of an X-ray diffraction of a LiNbO$_3$ thin film.
Figure 2B:
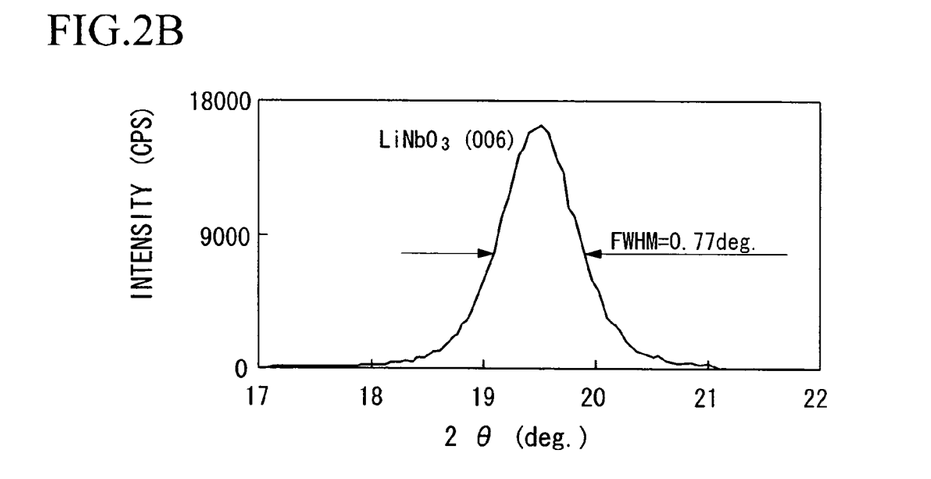
Figure 2C:
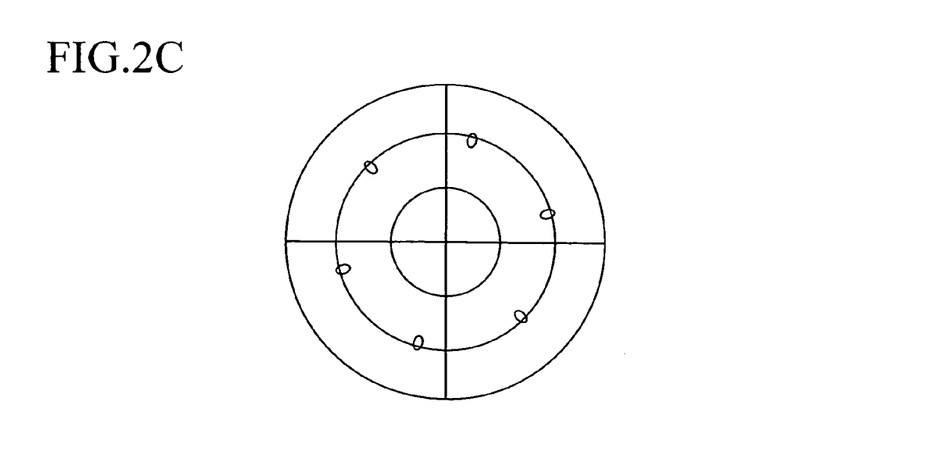

Here, the results obtained when the LiNbO$_3$ thin film (i.e., the piezoelectric thin film 3) is diffracted using X rays are shown in FIG. 2. FIG. 2A shows a scan of 2θ–θ, FIG. 2B shows a full width at half maximum (FWHM) of a LiNbO$_3$ (006) peak, and FIG. 2C shows a polar view of the LiNbO$_3$ (0012). From these it can be seen that the LiNbO$_3$ thin film is an epitaxial film with a (001) orientation. Moreover, the full width at half maximum exhibits an excellent crystallinity of 0.77°. Note that, although omitted here, from the results of the X ray diffraction of the buffer layer 2, three poles were also seen in a polar view of the $Y_2O_3$ (400), and it was confirmed that this buffer layer 2 formed a $Y_2O_3$ epitaxial thin film having a (111) orientation.

Next, a SiO2 film is formed using, for example, a laser ablation method as a protective film 4 on the piezoelectric thin film 3. This protective film 4 protects the piezoelectric thin film 3 from the atmosphere. At the same time as protecting it from the effects of moisture and impurities in the atmosphere, for example, it also fulfils the role of controlling the temperature characteristics of the piezoelectric thin film 3. Note that, as long as these objectives are met, the material of the protective layer is not limited to $SiO_2$.

Next, a thin aluminum film, for example, is formed on top of the protective layer 4. This is then patterned so as to form electrodes 5 having the desired configuration, which are known as IDT. As a result, the surface acoustic wave element shown in FIG. 1 is obtained.

When the characteristics of a surface acoustic wave element obtained in this manner were evaluated, by setting the film thickness of the piezoelectric thin film 3 (i.e., of the $LiNbO_3$ thin film) at 1 μm, a value of 3% was obtained for the electromechanical coupling coefficient ($k^2$) of this piezoelectric thin film 3. In addition, an excellent value of 3 dB was exhibited for the insertion loss. In contrast, in order to make a comparison, a $LiNbO_3$ thin film having a simple c axial orientation that did not grow epitaxially was formed as the piezoelectric thin film 3. When the insertion loss of this film was checked it was found to be 8 dB. Accordingly, it was confirmed that a piezoelectric thin film 3 that is an epitaxial film has better insertion loss characteristics. It is thought that this is due to epitaxial films having less surface acoustic wave scattering at the grain boundaries.

In this type of surface acoustic wave element, because the piezoelectric thin film 3 is formed on a buffer layer 2 that is formed by a crystal film, the piezoelectric thin film 3 is an epitaxial film and has an excellent film quality. Accordingly, the surface acoustic wave element itself also has excellent properties. Moreover, because a semiconductor device can be formed on the single crystal silicon substrate 1, integration with the semiconductor device is possible, and, accordingly, its development as a small size oscillator is also possible. In this case, because the buffer layer 2 has the function of preventing leakages of surface acoustic waves to the single crystal silicon substrate 1, the characteristics of the surface acoustic wave element can be maintained at an excellent level without any loss occurring.

Moreover, because a single crystal silicon substrate 1 is used as the single crystal substrate, this is lower in cost than, for example, sapphire substrates or the like. Therefore, it is possible to keep the cost of the surface acoustic wave element itself low.

In addition, because the buffer layer 2 is formed with a natural oxide film remaining on the surface of the single crystal silicon substrate 1, it is possible to omit the step of removing the natural oxide film using hydrofluoric acid or the like. Accordingly, an improvement in productivity is achieved. Furthermore, because there is no need to use hydrofluoric acid, which is a hazardous material, an advantage is also gained from the viewpoint of safety.

Furthermore, when a semiconductor device is formed on the single crystal silicon substrate 1, the buffer layer 2 is able to prevent alkaline metal in the piezoelectric thin film 3 from spreading into the single crystal silicon substrate 1. As a result, harmful effects of alkaline metal on the semiconductor device can be prevented.

Note that, in the above first embodiment, $Y_2O_3$ is used as the rare earth oxide buffer layer 2, however, instead of this it is also possible to use $Sc_2O_3$, $Yb_2O_3$, $Dy_2O_3$, $Ho_2O_3$, $Er_2O_3$, and the like.

Furthermore, in the first embodiment, a $LiNbO_3$ thin film is used as the piezoelectric thin film 3 having a hexagonal or trigonal crystal structure, however, instead of this it is possible to obtain the same effects using a ZnO thin film, a $LiTaO_3$ thin film, a $LiNb_{1-x}Ta_xO_3$ thin film (wherein 0<x<1), or an AlN thin film. An AlN thin film is particularly preferable for a high frequency surface acoustic wave element as the conducted acoustic velocity thereof is extremely fast.

(Second Embodiment)

Figure 3:
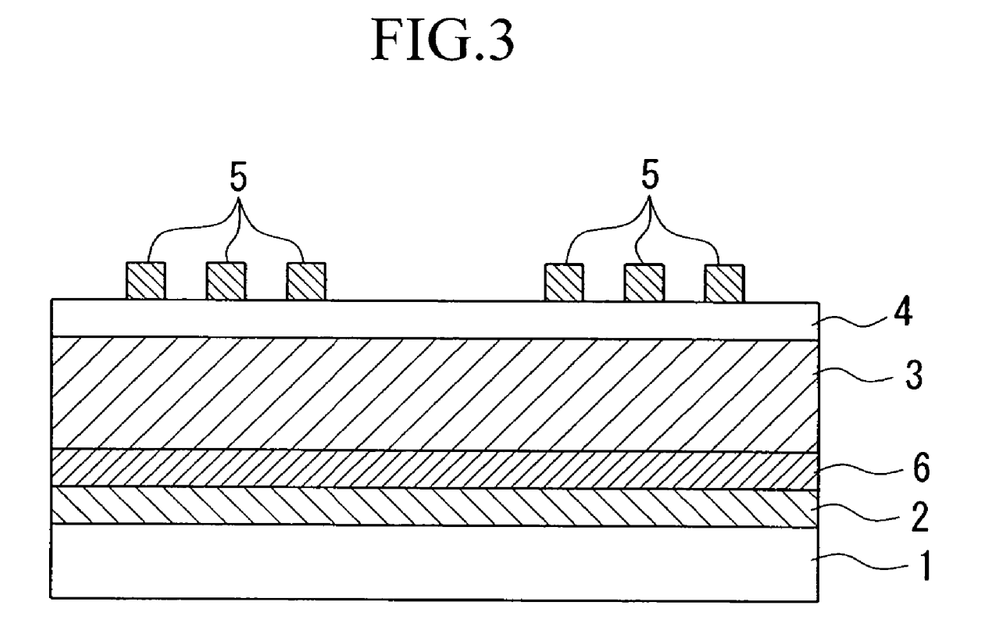
FIG. 3 is a side cross-sectional view showing a surface acoustic wave element according to the second embodiment.

FIG. 3 shows the structure of a surface acoustic wave element that is the second embodiment of the present invention. This surface acoustic wave element differs from the surface acoustic wave element of the first embodiment in that an electroconductive film 6 is interposed between the buffer layer 2 and the piezoelectric thin film 3.

In the present embodiment, a hexagonal system oxide ZnO thin film that is oxygen deficient is used as the electroconductive film 6. This ZnO thin film (i.e., the electroconductive film 6) is epitaxially grown in a c axial orientation on the above described buffer layer 2 formed by a $Y_2O_3$ (111) epitaxial thin film. This type of ZnO thin film (i.e., the electroconductive film 6) is obtained by film formation using a laser ablation method using, for example, ZnO ceramic as the target material in film forming conditions of an oxygen partial pressure of 1.3 Pa (0.01 Torr) or less and, from the viewpoint of crystallinity, a substrate temperature of 200° C. or more. A ZnO thin film obtained in this manner has a marked oxygen deficiency resulting in it becoming an electron carrier type of electroconductive film 6.

Here, although epitaxial growth is difficult to achieve if this type of ZnO thin film (i.e., electroconductive film 6) is formed directly on the single crystal silicon substrate 1 due to lattice mismatch and the like, it becomes achievable if a rare earth oxide is used for a buffer layer 22. Note that if the buffer layer 22 is amorphous, the ZnO thin film does not grow epitaxially. Namely, the ZnO thin film is a crystallized crystal film and, in particular, by forming it on top of the epitaxially grown buffer layer 2, the ZnO thin film (i.e., the electroconductive film 6) is also made to grow epitaxially.

Once the electroconductive film 6 is formed in this manner, in the same way as in the previous embodiment, the ZnO thin film is formed as a piezoelectric thin film 3 having a hexagonal crystal structure on the electroconductive film 6. However, here, a ZnO ceramic to which 5 mole % of Li has been added is used as the target material. The oxygen partial pressure is set to 13.3 Pa (0.1 Torr). As a result, in the same way as in the previous first embodiment, in this ZnO thin film (i.e., in the piezoelectric thin film 3), the crystal structure of the ZnO thin film of the foundation is continued, and the ZnO thin film also grows epitaxially. At this time, the orientation of the ZnO thin film is a c axial orientation.

Next, the protective film 4 is formed in the same way as in the previous first embodiment, and, by forming the electrodes 5 on top of this, the surface acoustic wave element shown in FIG. 3 is obtained.

In a surface acoustic wave element obtained in the above described manner, because, in particular, the electroconductive film 6 is formed and the piezoelectric thin film 3 formed by a ZnO thin film or the like is formed on top of the electroconductive film 6, a high electromechanical coupling coefficient ($k^2$) can be obtained even if the film thickness of the piezoelectric thin film 3 is made thin. For example, if the film thickness of the ZnO piezoelectric thin film 3 is uniformly set to 0.5 μm and a comparison is made between when the electroconductive film 6 is present and when it is absent, it is found that $k^2$ is 0.3% when there is no electroconductive film. In contrast, when there is an electroconductive film, $k^2$ is found to be a high 1%. This is advantageous from the process point of view. In addition, the insertion loss showed an excellent value of 4 dB. Note that, for the comparison, a ZnO thin film having a simple c axial orientation and with no epitaxial growth is formed as the piezoelectric thin film 3. The insertion loss thereof when checked was found to be 9 dB. Accordingly, in the same way as in the previous first embodiment, it was confirmed that a piezoelectric thin film 3 that is an epitaxial film has better insertion loss characteristics.

In this type of surface acoustic wave element, the same effects are exhibited as for the surface acoustic wave element of the previous first embodiment, and, moreover, even if, depending on the material used for the buffer layer 2, the piezoelectric thin film 3 is difficult to be placed directly on top of the buffer layer 2, by interposing the electroconductive film 6 between the two, it is possible to form a film with the piezoelectric thin film 3 orientated favorably. Accordingly, it is possible to select a material for the piezoelectric thin film 3 that is capable of increasing the electromechanical coefficient, and, as a result, the effect is achieved that it is possible to obtain an improvement in the performance of the surface acoustic wave element itself.

Note that, in this second embodiment, $Y_2O_3$ is used as the rare earth oxide buffer layer 2, however, instead of this it is also possible to use $Sc_2O_3$, $Yb_2O_3$, $Dy_2O_3$, $Ho_2O_3$, $Er_2O_3$, and the like.

Furthermore, in the second embodiment, a ZnO thin film is used as the piezoelectric thin film 3 having a hexagonal or trigonal crystal structure, however, instead of this it is possible to use a $LiNbO_3$ thin film, a $LiTaO_3$ thin film, a $LiNb_{1-x}Ta_xO_3$ thin film (wherein 0<x<1), or an AlN thin film. Here, if a ZnO thin film is used as the piezoelectric thin film 3, because the ZnO thin film has to be non-conductive, as was described above, during the film formation it is necessary to compensate for the oxygen deficiency by adding Li to the target or by raising the oxygen partial pressure during the film formation.

Furthermore, in the second embodiment, oxygen deficient ZnO is used for the electroconductive film 6, however, instead of this it is possible to obtain the same effects by using a metal film such as Al, Pt, Ir, or the like.

Furthermore, in the first and second embodiments, a single crystal silicon substrate is used as the single crystal substrate, however, it is also possible to use, for example, single crystal substrates of gallium or arsenic and the like. In such cases as well, it is possible to form a semiconductor device on the substrate and to integrate the surface acoustic wave element and the semiconductor device.

(Third Embodiment)

Figure 4:
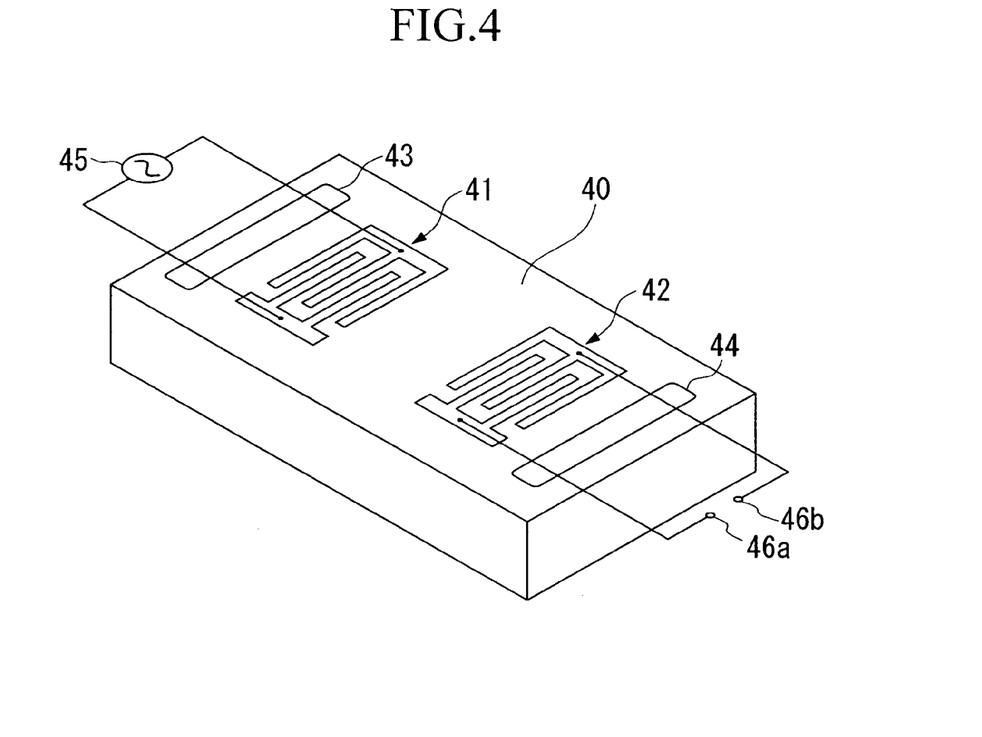
FIG. 4 is a perspective view showing a frequency filter according to the third embodiment.

FIG. 4 shows an exterior of a frequency filter of the third embodiment.

As is shown in FIG. 4, the frequency filter has a substrate 40. As this substrate 40 it is possible, for example, to use a substrate on which the surface acoustic wave element shown in FIG. 1 is formed or a substrate on which the surface acoustic wave element shown in FIG. 3 is formed. Namely, if the substrate is one on which the surface acoustic wave element shown in FIG. 1 is formed, then the substrate is a single crystal silicon substrate 1 on which are stacked a buffer layer 2, a piezoelectric thin film 3, and a protective layer 4 in that order. If the substrate is one on which the surface acoustic wave element shown in FIG. 3 is formed, then the substrate is a single crystal silicon substrate 1 on which are stacked a buffer layer 2, an electroconductive layer 6, a piezoelectric thin film 3, and a protective layer 4 in that order.

IDT electrodes 41 and 42 are formed on a top surface of the substrate 40. The IDT electrodes 41 and 42 may be formed, for example, from Al or from an Al alloy, and the thickness thereof is set at approximately $\frac{1}{100}^{th}$ the pitch of the IDT electrodes 41 and 42. In addition, sound absorbing portions 43 and 44 are formed on the top surface of the substrate 40 so as to sandwich the IDT electrodes 41 and 42. The sound absorbing portions 43 and 44 absorb surface acoustic waves propagated over the surface of the substrate 40. A high frequency signal source 45 is connected to the IDT electrode 41 formed on the substrate 40, while signal wiring is connected to the IDT electrode 42.

In the above structure, when a high frequency signal is output from the high frequency signal source 45, this high frequency signal is applied to the IDT electrode 41. As a result, a surface acoustic wave is generated on the top surface of the substrate 40. This surface acoustic wave propagates over the top surface of the substrate 40 at a speed of approximately 5000 m/s. Surface acoustic waves propagating from the IDT electrode 41 towards the sound absorbing portion 43 are absorbed by the sound absorbing portion 43. However, of the surface acoustic waves that propagate towards the IDT electrode 42, those surface acoustic waves that have a specific frequency that is decided in accordance with pitch of the IDT electrode 42 and the like, or that have the frequencies of a specific band are converted into electrical signals, and are fetched to terminals 46a and 46b via the signal wiring. Note that a majority of frequency components other than those of the specific frequency or of the frequencies of the specific band are absorbed by the sound absorbing portion 44 after passing through the IDT electrode 42. By employing this type of structure, it is possible to obtain surface acoustic waves that are solely of a specific frequency or of the frequencies of a specific band from among electrical signals supplied to the IDT electrode 41 that is provided in the frequency filter of the present embodiment (i.e., it is possible to perform filtering).

(Fourth Embodiment)

Figure 5:
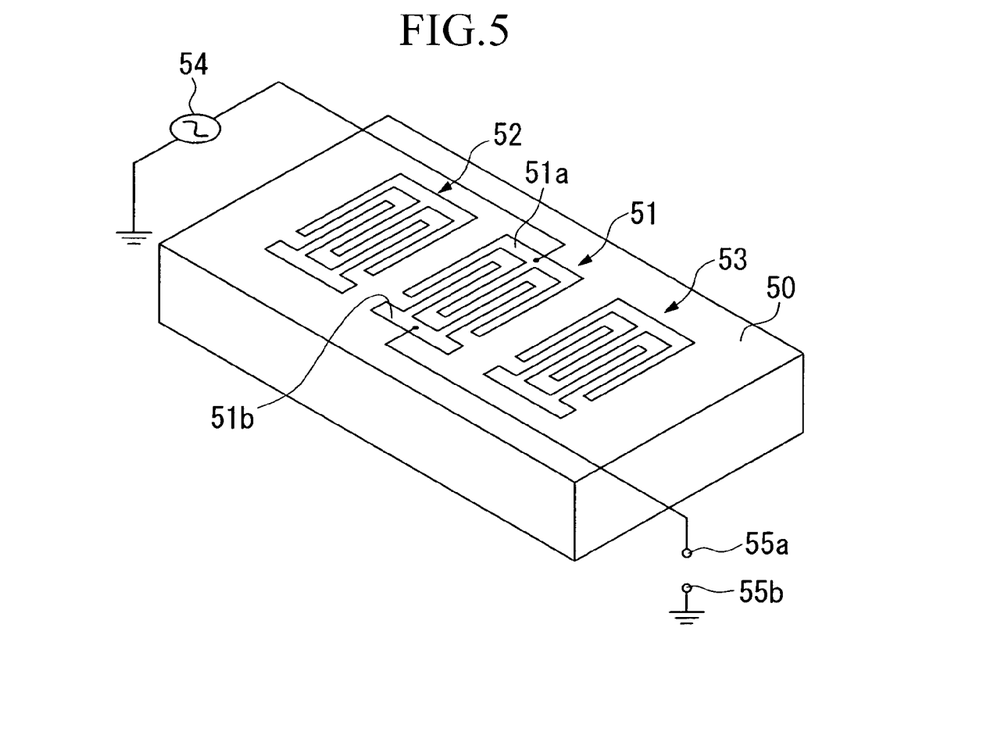
FIG. 5 is a perspective view showing an oscillator according to the fourth embodiment.

FIG. 5 shows an exterior of an oscillator of the fourth embodiment.

As is shown in FIG. 5, the oscillator has a substrate 50. In the same manner as in the previous third embodiment, as this substrate 50 it is possible, for example, to use a substrate on which the surface acoustic wave element shown in FIG. 1 is formed or a substrate on which the surface acoustic wave element shown in FIG. 3 is formed. Namely, if the substrate is one on which the surface acoustic wave element shown in FIG. 1 is formed, then the substrate is a single crystal silicon substrate 1 on which are stacked a buffer layer 2, a piezoelectric thin film 3, and a protective layer 4 in that order. If the substrate is one on which the surface acoustic wave element shown in FIG. 3 is formed, then the substrate is a single crystal silicon substrate 1 on which are stacked a buffer layer 2, an electroconductive layer 6, a piezoelectric thin film 3, and a protective layer 4 in that order.

On a top surface of the substrate 50 is formed an IDT electrode 51 together with IDT electrodes 52 and 53 that are formed so as to sandwich the IDT electrode 51. The IDT electrodes 51 to 53 may be formed, for example, from Al or from an Al alloy, and the thicknesses thereof are set at approximately $\frac{1}{100}^{th}$ the pitch of the IDT electrodes 51 to 53. A high frequency signal source 54 is connected to one comb tooth shaped electrode 51a that forms the IDT electrode 51, while signal wiring is connected to the other comb tooth shaped electrode 51b that forms the IDT electrode 51. Note that the IDT electrode 51 corresponds to an electrode for applying electrical signals, while the IDT electrodes 52 and 53 correspond to electrodes for oscillation that oscillate a specific frequency component or frequency components of a specific band of surface acoustic waves that are generated by the IDT electrode 51.

In the above described structure, if a high frequency signal is output from the high frequency signal source 54, this high frequency signal is applied to the one comb tooth shaped electrode 51a of the IDT electrode 51. As a result, surface acoustic waves that propagate towards the IDT electrode 52 and surface acoustic waves that propagate towards the IDT electrode 53 are generated on the top surface of the substrate 50. The speed of these surface acoustic waves is approximately 5000 m/s. Surface acoustic waves of a specific frequency component from among these surface acoustic waves are reflected by the IDT electrode 52 and the IDT electrode 53, and a standing wave is generated between the IDT electrode 52 and the IDT electrode 53. As a result of the surface acoustic waves of this specific frequency component being repeatedly reflected by the IDT electrodes 52 and 53, the specific frequency component or the frequency components of a specific band are resonated, and the amplitude increases. A portion of the surface acoustic waves of this specific frequency component or of the frequency components of a specific band are fetched from the other comb tooth shaped electrode 51b of the IDT electrode 51, and electrical signals of a frequency that corresponds to the resonance frequency of the IDT electrode 52 and the IDT electrode 53 (or a frequency having a band of a particular size) are fetched to a terminal 55a and a terminal 55b.

Figure 6A:
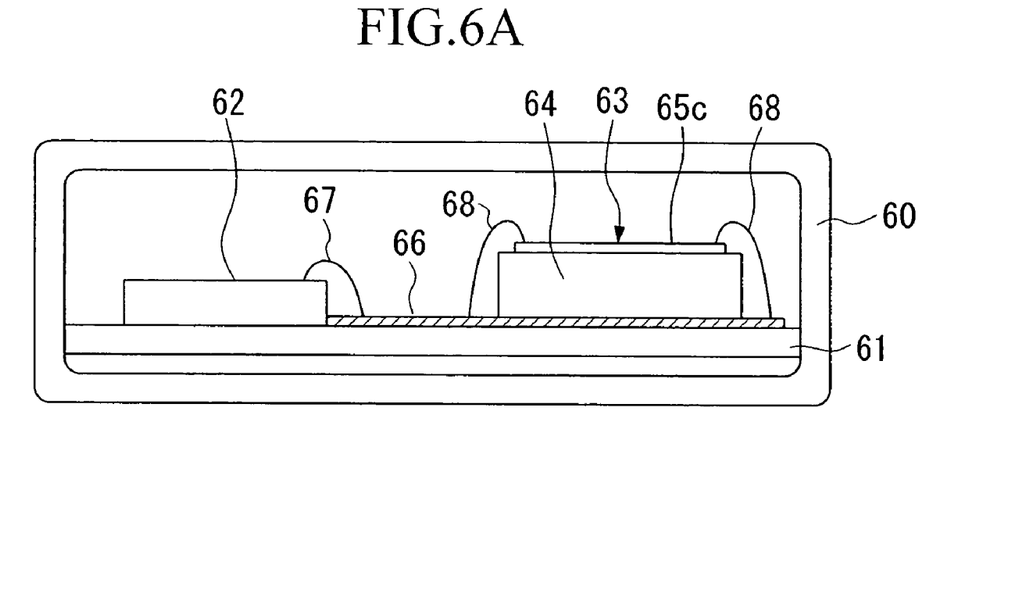
FIG. 6 is a schematic view showing an example of when the oscillator of FIG. 5 is applied to VCSO.
Figure 6B:
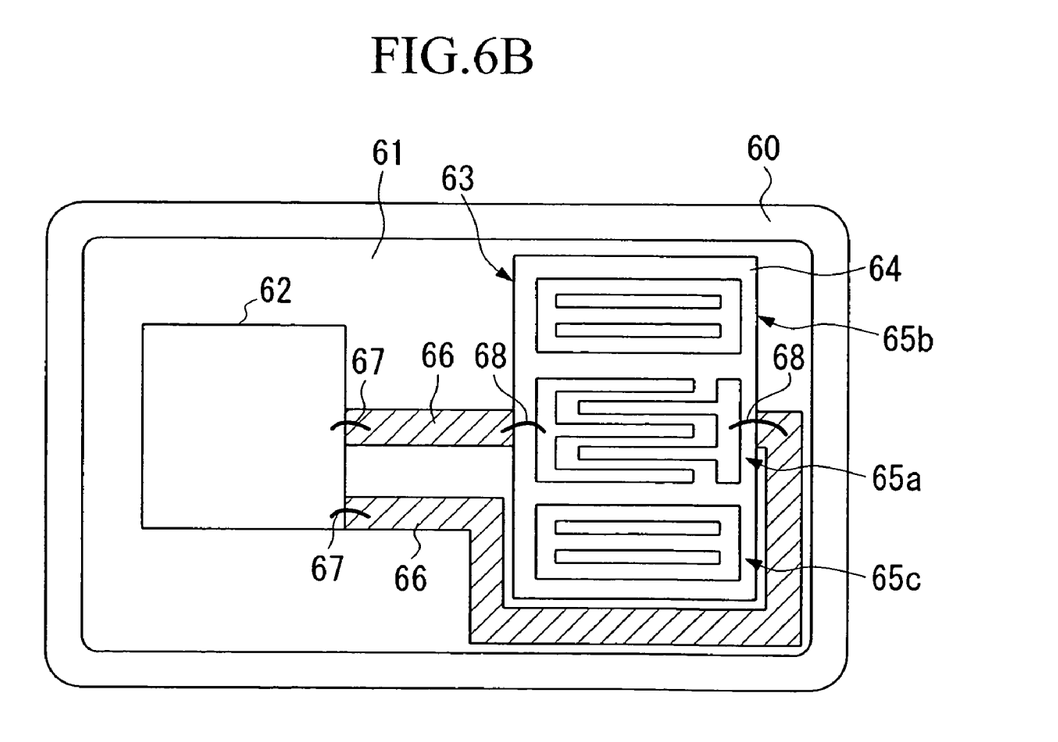

FIG. 6 shows an example when the oscillator (i.e., the surface acoustic wave element) of the present invention is applied to a voltage controlled SAW oscillator (VCSO). FIG. 6A is a side perspective view and FIG. 6B is a top perspective view.

The VCSO is packaged inside a metal (made, for example, from Al or stainless steel) housing 60. On a substrate 61 are packaged an integrated circuit (IC) 62 and an oscillator 63. In this case, the IC 62 is an oscillation circuit that controls frequencies applied to the oscillator 63 in accordance with a voltage value input from an external circuit (not shown).

In the oscillator 63, IDT electrodes 65a to 65c are formed on top of a substrate 64, and the structure of the oscillator 63 is substantially the same as that of the oscillator shown in FIG. 5. Note that, in the same manner as in the previous fourth embodiment, for example, a substrate on which the surface acoustic wave element shown in FIG. 1 is formed or a substrate on which the surface acoustic wave element shown in FIG. 3 is formed is used as the substrate 64.

Wiring 66 that electrically connects the IC 62 with the oscillator 63 is patterned onto the top of the substrate 61. The IC 62 and the wiring 66 may be connected, for example, by wires 67 such as metal wires, and the oscillator 63 and the wiring 66 may be connected by wires 68 such as metal wires. As a result, the IC 62 and the oscillator 63 are electrically connected via the wiring 66.

It is also possible for the VCSO to be formed with the IC 62 and the oscillator (i.e., the surface acoustic wave element) 63 integrated on the same substrate.

Figure 7:
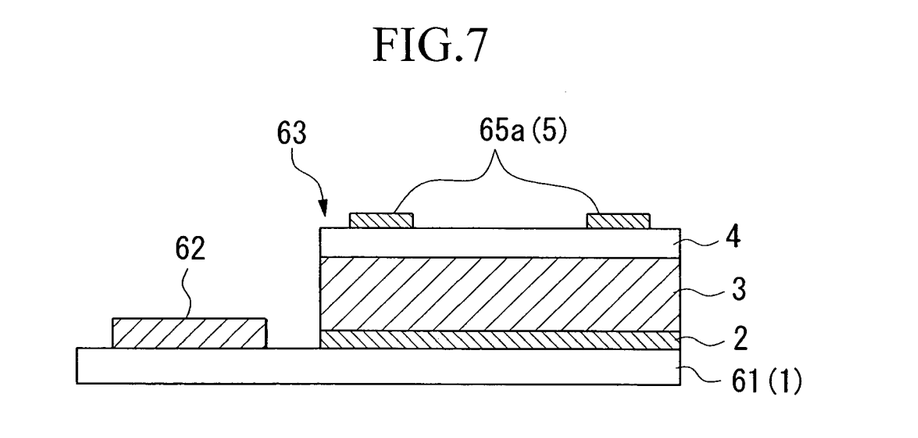
FIG. 7 is a schematic view showing an example of when the oscillator of FIG. 5 is applied to VCSO.

FIG. 7 is a schematic view of a VCSO in which the IC 62 and the oscillator 63 are integrated. Note that, in FIG. 7, the oscillator 63 has the structure of the surface acoustic wave element of the first embodiment, and the same reference characters are used for component elements that are the same as those shown in FIGS. 1 and 6.

As is shown in FIG. 7, the VCSO is formed with the IC 62 and the oscillator 63 sharing a single crystal silicon substrate 61(1). The IC 62 and the electrodes 65a provided on the oscillator 63 are electrically connected (not shown). In the present embodiment, a thin film transistor (TFT), in particular, may be used as the transistor forming the IC 62.

By employing a TFT as the transistor forming the IC 62, in the present embodiment, firstly, the oscillator (i.e., the surface acoustic wave element) 63 can be formed on the single crystal silicon substrate 61. Next, a TFT formed on a second substrate different from the single crystal silicon substrate 61 is transferred onto the single crystal silicon substrate 61 so that the TFT and the oscillator 63 can be integrated. Accordingly, even if it is difficult to directly form the TFT on the substrate, or if the material is not suitable for such a forming process, it is possible by transferal to achieve a suitable formation. A variety of methods can be used for the transfer method, however, the transfer method described in Japanese Patent Application Unexamined Publication No. 11-26733 is particularly preferably employed.

Figure 8:
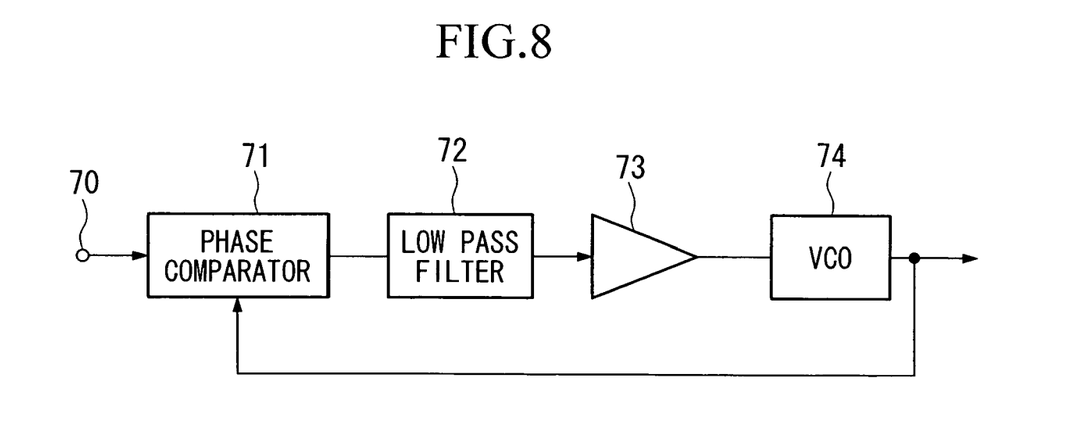
FIG. 8 is a block diagram showing the basic structure of a PLL circuit.

The VCSO shown in FIGS. 6 and 7 may be used, for example, as a voltage controlled oscillator (VCO) of the PLL circuit shown in FIG. 8. Here, a simple description of a PLL circuit will be given.

FIG. 8 is a block diagram showing the basic structure of a PLL circuit. As is shown in FIG. 8, the PLL circuit is formed by a phase comparator 71, a low pass filter 72, an amplifier 73, and a VCO 74. The phase comparator 71 compares phases (or frequencies) of signals input from an input terminal 70 with phases (or frequencies) of signals output from the VCO 74, and outputs an error voltage signal whose value is set in accordance with the comparison difference. The low pass filter 72 allows only low frequency components at a position of the error voltage signals output from the phase comparator 71 to pass. The amplifier 73 amplifies signals output from the low pass filter 72. The VCO 74 is an oscillation circuit whose oscillation frequency changes continuously within a particular range in accordance with input voltage values.

A PLL circuit having the above described structure operates such that the difference between the phase (or frequency) input from the input terminal 70 and the phase (or frequency) of a signal output from the VCO 74 decreases, and synchronizes the frequency of a signal output from the VCO 74 with the frequency of a signal input from the input terminal 70. If the frequency of a signal output from the VCO 74 is synchronized with the frequency of a signal input from the input terminal 70, thereafter, apart from a uniform phase difference, signals can be output that match the signals input from the input terminal 70 and that follow changes in the input signals.

(Fifth Embodiment)

Figure 9:
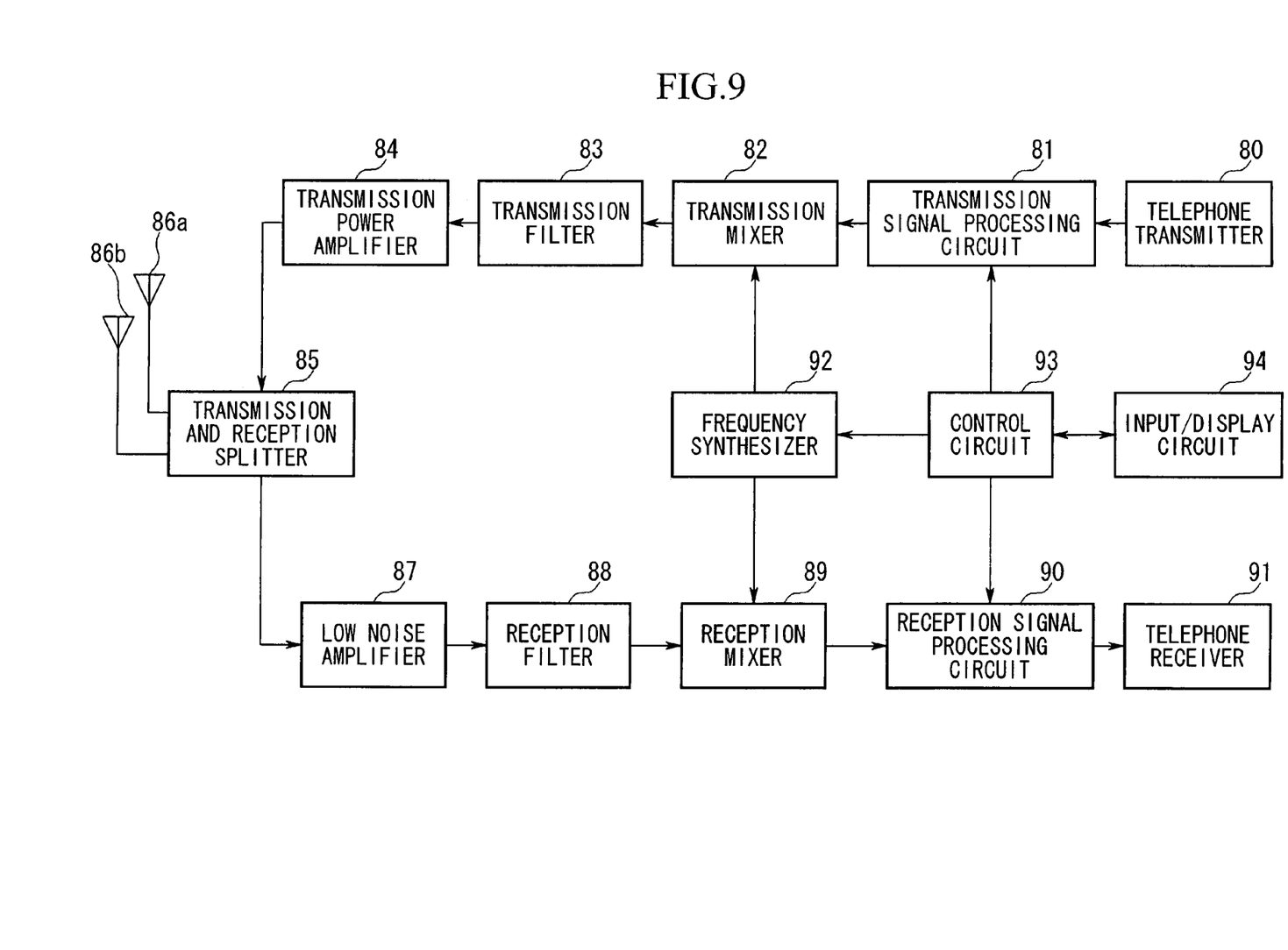
FIG. 9 is a block diagram showing the structure of an electronic circuit according to the fifth embodiment.

FIG. 9 is a block diagram showing the electrical structure of an electronic circuit of the fifth embodiment. Note that the electronic circuit shown in FIG. 9 may, for example, be a circuit provided inside the mobile telephone 100 shown in FIG. 10. Here, the mobile telephone 100 shown in FIG. 10 serves as an example of the electronic instrument of the present invention and is provided with an antenna 101, a telephone receiver 102, a telephone transmitter 103, a liquid crystal display unit 104, and an operation button unit 105 and the like.

The electronic circuit shown in FIG. 9 has the basic structure of an electronic circuit provided in the mobile telephone 100 and is provided with a telephone transmitter 80, a transmission signal processing circuit 81, a transmission mixer 82, a transmission filter 83, a transmission power amplifier 84, a transmission and reception splitter 85, antennas 86a and 86b, a low noise amplifier 87, a reception filter 88, a reception mixer 89, a reception signal processing circuit 90, a telephone receiver 91, a frequency synthesizer 92, a control circuit 93, and an input/display circuit 94. Note that because mobile telephones that are currently in actual use perform frequency conversion processing a plurality of times, the circuit structures thereof are more complex.

Figure 10:
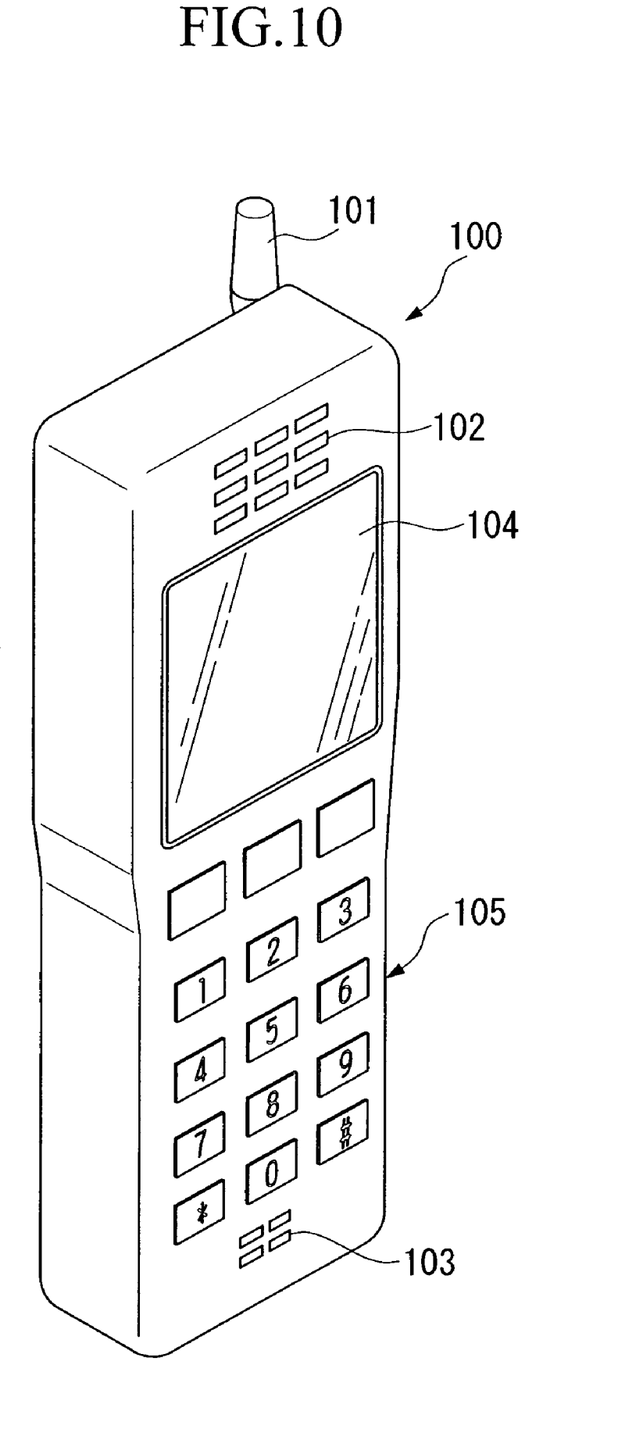
FIG. 10 is a perspective view showing a mobile phone as an embodiment of an electronic instrument.

The telephone transmitter 80 is realized by a microphone that converts acoustic signals, for example, into electrical signals, and corresponds to the telephone transmitter 103 of the mobile telephone 100 shown in FIG. 10. The transmission signal processing circuit 81 is a circuit that performs processing such as, for example, D/A conversion processing and modulation processing on electrical signals output from the telephone transmitter 80. The transmission mixer 82 mixes signals output from the transmission signal processing circuit 81 using signals output from the frequency synthesizer 92. Note that the frequency of signals supplied to the transmission mixer 82 may be, for example, approximately 380 MHz. The transmission filter 83 allows only signals of frequencies required by an intermediate frequency (referred to below as IF) and cuts out signals of non-required frequencies. Note that signals output from the transmission filter 83 are converted into RF signals by a conversion circuit (not shown). The frequency of these RF signals may be, for example, approximately 1.9 GHz. The transmission power amplifier 84 amplifies the power of RF signals output from the transmission filter 83 and then outputs them to the transmission and reception splitter 85.

The transmission and reception splitter 85 outputs RF signals output from the transmission power amplifier 84 to the antennas 86a and 86b, and transmits them from the antennas 86a and 86b in the form of a radio wave. The transmission and reception splitter 85 also splits reception signals received by the antennas 86a and 86b, and outputs them to the low noise amplifier 87. Note that the frequency of reception signals output from the transmission and reception splitter 85 may be, for example, approximately 2.1 GHz. The low noise amplifier 87 amplifies reception signals from the transmission and reception splitter 85. Note that signals output from the low noise amplifier 87 are converted into IF by a conversion circuit (not shown).

The reception filter 88 allows only signals of frequencies required by the IF converted by the conversion circuit (not shown) to pass, and cuts out signals of frequencies that are not required. The reception mixer 89 mixes signals output from the transmission signal processing circuit 81 using signals output from the frequency synthesizer 92. Note that the intermediate frequency supplied to the reception mixer 89 may be, for example, approximately 190 MHz. The reception signal processing circuit 90 is a circuit that performs processing such as A/D conversion processing and demodulation processing on signals output from the reception mixer 89. The telephone receiver 91 may be realized, for example, by a small size speaker that converts electrical signals into sound waves, and corresponds to the telephone receiver 102 of the mobile telephone 100 shown in FIG. 10.

The frequency synthesizer 92 is a circuit that generates signals (for example, of a frequency of approximately 380 MHz) supplied to the transmission mixer 82 and signals (for example, of a frequency of approximately 190 MHz) supplied to the reception mixer 89. Note that the frequency synthesizer 92 is provided with a PLL circuit that emits signals in an oscillation frequency of, for example, 760 MHz. The frequency synthesizer 92 divides the signals output from this PLL circuit and creates signals of a frequency of 380 MHz. The frequency synthesizer 92 then further divides these signals to create signals of a frequency of 190 MHz. The control circuit 93 controls the overall operation of the mobile telephone by controlling the transmission signal processing circuit 81, the reception signal processing circuit 90, the frequency synthesizer 92, and the input/display circuit 94. The input/display circuit 94 displays the state of the instrument to the user of the mobile telephone 100 shown in FIG. 10 and is used for the input of instructions from an operator. The input/display circuit 94 corresponds, for example, to the liquid crystal display unit 104 and the operation button unit 105 of the mobile telephone 100.

In an electronic circuit having the above structure the frequency filter shown in FIG. 4 is used for the transmission filter 83 and the reception filter 88. Filtered frequencies (i.e., frequencies that are allowed to pass) are set separately in the transmission filter 83 and the reception filter 88 in accordance with required frequencies from among the signals output from the transmission mixer 82 and with frequencies that are required by the reception mixer 89. In addition, the PLL circuit provided in the frequency synthesizer 92 is obtained by providing the oscillator shown in FIG. 5 or the oscillator (VCSO) shown in FIGS. 6 and 7 as the VCO 74 of the PLL circuit shown in FIG. 8.

The surface acoustic wave element, frequency filter, oscillator and method of manufacturing the same, electronic circuit, and electronic instrument (i.e., the mobile telephone 100) according to embodiments of the present invention are described above, however, the present invention is not limited to these embodiments and various modifications thereof are possible within the scope of the present invention.

For example, in the above described embodiments, a mobile telephone is described as an example of an electronic instrument, and an electronic circuit provided inside the mobile telephone is described as an example of an electronic circuit, however, the present invention is not limited to a mobile telephone and may be applied to a variety of mobile communication instruments and to electronic circuits provided therein.

Furthermore, the present invention may also be applied not only to mobile communication instruments, but to communication instruments that are used in a deferred state such as tuners and the like that receive BS and CS broadcasts, and to electronic circuits provided therein. Moreover, the present invention may also be applied not only to communication instruments that use radio waves propagated through space as communication carriers, but to electronic instruments such as HUB that use high frequency signals propagated along a coaxial cable or optical signals propagated along an optical cable, and to electronic circuits provided therein.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as limited by the foregoing description and is only limited by the scope of the appended claims.

What is claimed is:

1. A surface acoustic wave element comprising:
   a single crystal substrate;
   a buffer layer formed by a crystal film that is formed on said single crystal substrate;
   a piezoelectric thin film having a hexagonal system or a trigonal system crystal structure that is formed on said buffer layer; and
   an electroconductive film provided between said buffer layer and said piezoelectric thin film;
   wherein said electroconductive film is formed from a hexagonal system oxide, said hexagonal system oxide being an oxygen deficient electron carrier type of zinc oxide.

2. The surface acoustic wave element according to claim 1, wherein said single crystal substrate is a single crystal silicon substrate.

3. The surface acoustic wave element according to claim 2, wherein said single crystal silicon substrate has a face orientation of (111).

4. The surface acoustic wave element according to claim 2, wherein said buffer layer is an epitaxial film.

5. The surface acoustic wave element according to claim 2, wherein said buffer layer is formed by a rare earth oxide.

6. The surface acoustic wave element according to claim 5, wherein said single crystal substrate has a natural oxide film formed from a silicon oxide formed on a surface thereof.

7. The surface acoustic wave element according to claim 1, wherein said piezoelectric thin film is an epitaxial film.

8. The surface acoustic wave element according to claim 1, wherein said piezoelectric thin film having a hexagonal system or trigonal system crystal structure is any one of ZnO, AlN, $LiTaO_3$, $LiNbO_3$, or $LiNb_{1-x}Ta_xO_3$ (wherein $0 < x < 1$).

9. The surface acoustic wave element according to claim 1, wherein said electroconductive film is an epitaxial film.

10. A frequency filter comprising:
    a first electrode that is formed on said piezoelectric thin film or on a protective film provided on said piezoelectric thin film that is provided in the surface acoustic wave element according to claim 1; and
    a second electrode that is formed on said piezoelectric thin film or said protective film, and that converts surface acoustic waves generated in said piezoelectric thin film by electrical signals applied to said first electrode into electrical signals in resonance with a specific frequency or with frequencies of a specific band.

11. An electronic instrument provided with the frequency filter according to claim 10.

12. An oscillator comprising:
    an electrode for applying electrical signals that is formed on said piezoelectric thin film or on a protective film formed on said piezoelectric thin film that is provided in the surface acoustic wave element according to claim 1, and that generates surface acoustic waves in said piezoelectric thin film using electrical signals applied thereto; and
    an oscillation circuit that is formed on said piezoelectric thin film or said protective film, and that includes a transistor and a resonating electrode that resonates a specific frequency component or frequency components of a specific band of the surface acoustic waves generated by said electrode for applying electrical signals.

13. An electronic circuit comprising: the oscillator according to claim 12; and
    an electrical signal supply element that applies the electrical signals to said electrode for applying electrical signals provided in said oscillator, wherein
    said electronic circuit has a function of selecting a specific frequency component from frequency components of the electrical signals, or of converting the electrical signals into a specific frequency component, or of imparting predetermined modulation to the electrical signals and performing a predetermined demodulation, or of performing a predetermined wave detection.

* * * * *